(12) United States Patent
Hsiao et al.

(10) Patent No.: US 8,649,184 B2
(45) Date of Patent: Feb. 11, 2014

(54) SIGNAL CONVERSION DEVICE WITH DUAL CHIP

(75) Inventors: Feng Chi Hsiao, Taipei (TW); Kun Shan Yang, Taipei (TW); Tung Fu Lin, Taipei (TW); Chin Fen Cheng, Taipei (TW); Chih Wei Lee, Taipei (TW)

(73) Assignee: Phytrex Technology Corporation, Taipei (TW)

( * ) Notice: Subject to any disclaimer, the term of this patent is extended or adjusted under 35 U.S.C. 154(b) by 676 days.

(21) Appl. No.: 12/787,978

(22) Filed: May 26, 2010

(65) Prior Publication Data

US 2010/0309642 A1    Dec. 9, 2010

(30) Foreign Application Priority Data

May 27, 2009   (TW) .............................. 98209358 U

(51) Int. Cl.
    *H05K 1/11*    (2006.01)
(52) U.S. Cl.
    USPC ........... 361/784; 361/748; 361/760; 361/763; 361/777; 361/782

(58) Field of Classification Search
    USPC .................. 361/748, 760, 763, 782, 784, 777
    See application file for complete search history.

(56) References Cited

U.S. PATENT DOCUMENTS 7,619,901 B2 *  11/2009  Eichelberger et al. ........ 361/763

* cited by examiner

*Primary Examiner* — Robert J Hoffberg
*Assistant Examiner* — Hung Dang
(74) *Attorney, Agent, or Firm* — Morris Manning & Martin LLP; Tim Tingkang Xia, Esq.

(57) ABSTRACT

The present invention provides a dual chip signal conversion device, comprising: a carrier, one side surface thereof being provided with at least a first contact and a second contact while the other side surface thereof being provided with at least a third contact and a fourth contact; a first chip disposed at one side surface of the carrier and electrically connected to the second and fourth contacts; a second chip disposed at one side surface of the carrier and electrically connected to the first chip; and an antenna disposed within the carrier and electrically connected to the second chip.

7 Claims, 4 Drawing Sheets

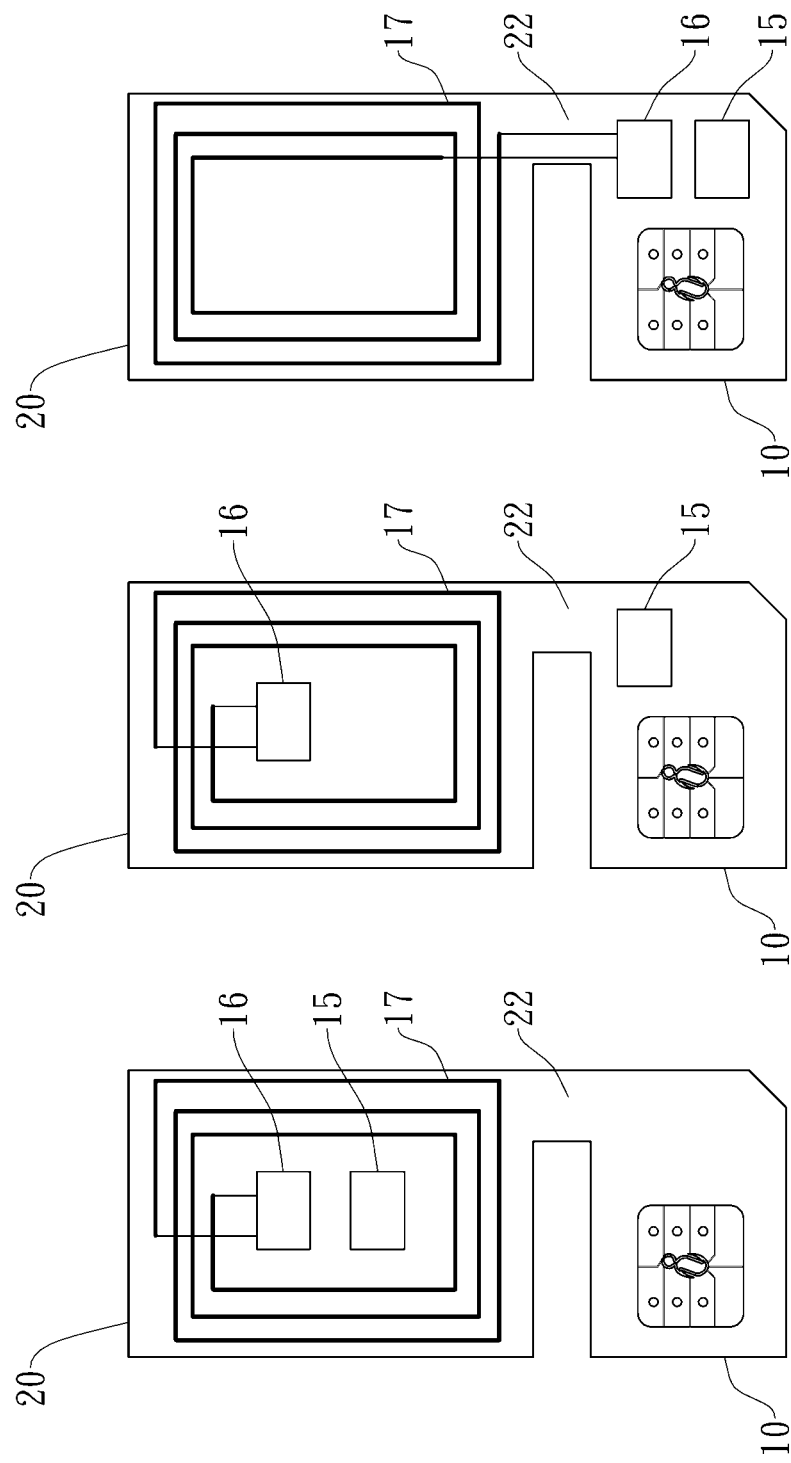

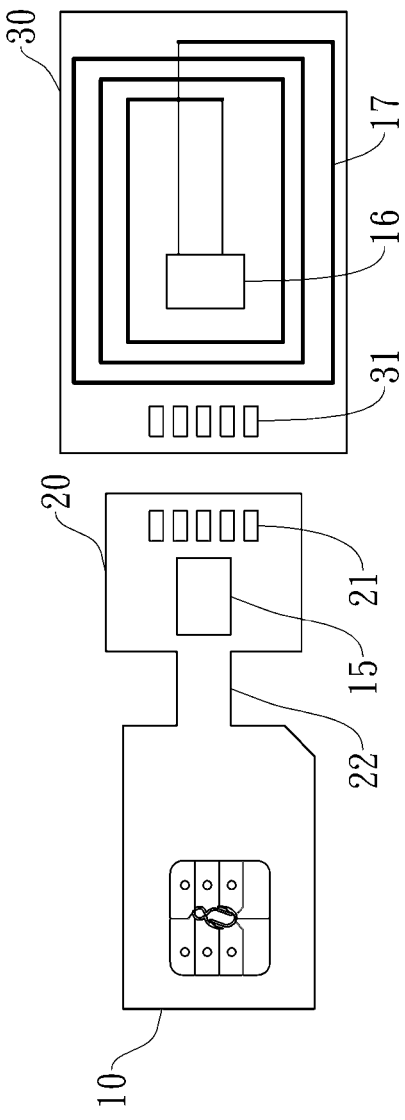
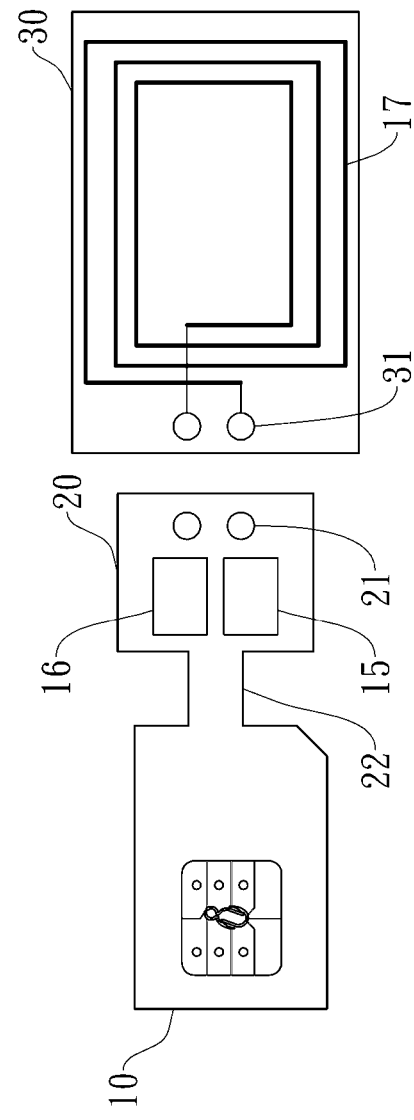

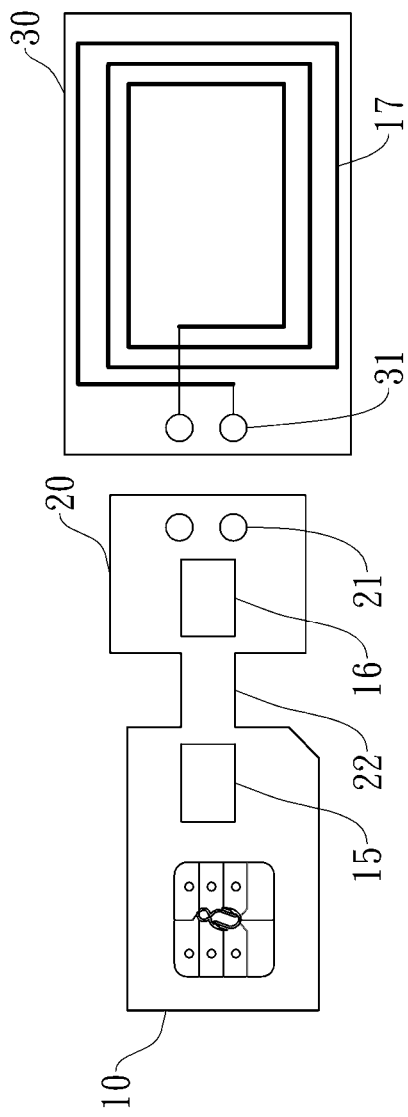
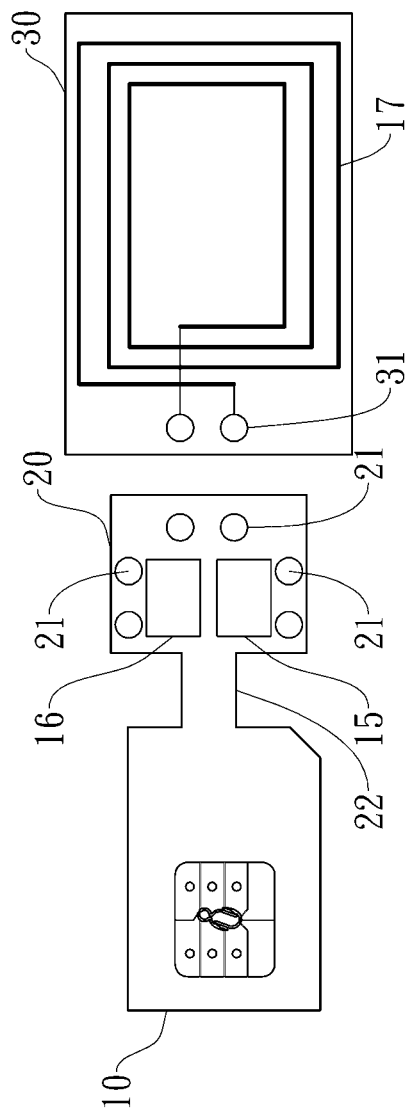
Fig. 3C
Fig. 3D

US 8,649,184 B2

SIGNAL CONVERSION DEVICE WITH DUAL CHIP

BACKGROUND OF THE INVENTION

1. Field of the Invention

The present invention relates to a dual chip signal conversion device applicable to the Subscriber Identify Module (SIM), and more particularly, to the technical field regarding the integration of dual cards.

2. Description of the Prior Art

According to the National Communications Commission (NCC), there were 24.68 million mobile phone subscribers in Taiwan by the end of June, 2008, that is, everyone in the country had more than one mobile phone. The phenomenal popularity of mobile phones in Asia indicates that the mobile phone has become an essential device for both personal and professional use. While some may use the mobile phone to take photos and listen to music, the majority of mobile phone users simply use the gadget to make/receive phone calls and send/receive messages. Currently, a SIM card is used in a mobile phone to store the user's phone number, phone book and system information, such as the Personal Identification Number (PIN) code and user ID, and to perform antitheft function, access control function, etc. However, people's heavy reliance on mobile phones gives rise to the needs to integrate the near field communication (NFC) functions, such as the functions of EasyCard, credit card and entrance card, into a SIM card. Near Field Communication or NFC is a short-range high frequency wireless communication technology which enables two electronic devices to access/read in data from contactless cards through contactless point to point communication, thereby to safely exchange data.

As the integration of relevant value-added services to a SIM card without changing the structure of the SIM card is industrially applicable, the present invention provides a dual chip signal conversion device.

SUMMARY OF THE INVENTION

The present invention provides a dual chip signal conversion device in which a thin film carrier may be provided with two chips and an antenna so as to be attached to a SIM card.

To achieve the aforementioned object, the present invention provides a dual chip signal conversion device, comprising: a carrier, one side surface thereof being provided with at least a first contact and a second contact while the other side surface thereof being provided with at least a third contact and a fourth contact; a first chip disposed at one side surface of the carrier and electrically connected to the second and fourth contacts; a second chip disposed at one side surface of the carrier and electrically connected to the first chip; and an antenna disposed within the carrier and electrically connected to the second chip.

To achieve the aforementioned object, the present invention provides another dual chip signal conversion device, comprising: a carrier comprising a first substrate, a second substrate and a connecting portion for connecting the first and second substrates, one side surface of the first substrate being provided with at least a first contact and a second contact while the other side surface of the first substrate being provided with at least a third contact and a fourth contact, there being an electrical connection between the first and third contacts; a first chip disposed at one side surface of the first substrate and electrically connected to the second and fourth contacts via the connecting portion; a second chip disposed at one side surface of the second substrate and electrically connected to the first chip; and an antenna disposed within the second substrate and electrically connected to the second chip.

To achieve the aforementioned object, the present invention provides yet another dual chip signal conversion device, comprising: a carrier comprising a first substrate, a second substrate and a connecting portion for connecting the first and second substrates, one side surface of the first substrate being provided with at least a first contact and a second contact while the other side surface of the first substrate being provided with at least a third contact and a fourth contact, there being an electrical connection between the first and third contacts; a first chip disposed at one side surface of the first substrate and electrically connected to the second and fourth contacts; a second chip disposed at one side surface of the second substrate and electrically connected to the first chip via the connecting portion; and an antenna disposed within the second substrate and electrically connected to the second chip.

To achieve the aforementioned object, the present invention provides yet another dual chip signal conversion device, comprising: a carrier comprising a first substrate, a second substrate and a connecting portion for connecting the first and second substrates, one side surface of the first substrate being provided with at least a first contact and a second contact while the other side surface of the first substrate being provided with at least a third contact and a fourth contact, there being an electrical connection between the first and third contacts; a first chip disposed at one side surface of the first substrate and electrically connected to the second and fourth contacts; a second chip disposed at one side surface of the first substrate and electrically connected to the first chip; and an antenna disposed within the second substrate and electrically connected to the second chip via the connecting portion.

To achieve the aforementioned object, the present invention provides yet another dual chip signal conversion device, comprising: a first substrate, one side surface thereof being provided with at least a first contact and a second contact while the other side surface thereof being provided with at least a third contact and a fourth contact, there being an electrical connection between the first and third contacts; a second substrate having a plurality of electrical contacts; a connecting portion for connecting the first and second substrates; a third substrate having a plurality of electrical contacts; a first chip disposed at one side surface of the second substrate, the first chip being electrically connected to the second and fourth contacts via the connecting portion and to the plurality of electrical contacts of the second substrate; a second chip disposed at one side surface of the third substrate and electrically connected to the plurality of electrical contacts of the third substrate; and an antenna disposed within the third substrate and electrically connected to the second chip; wherein the second and third substrates are electrically connected via their respective plurality of electrical contacts.

To achieve the aforementioned object, the present invention provides yet another dual chip signal conversion device, comprising: a first substrate, one side surface thereof being provided with at least a first contact and a second contact while the other side surface thereof being provided with at least a third contact and a fourth contact, there being an electrical connection between the first and third contacts; a second substrate having a plurality of electrical contacts; a connecting portion for connecting the first and second substrates; a third substrate having a plurality of electrical contacts; a first chip disposed at one side surface of the second substrate and electrically connected to the second and fourth contacts via the connecting portion; a second chip disposed at one side surface of the second substrate, the second chip being electrically connected to the first chip and to the plurality of electrical contacts of the second substrate; and an antenna disposed within the third substrate and electrically connected to the plurality of electrical contacts of the third substrate; wherein the second and third substrates are electrically connected via their respective plurality of electrical contacts.

To achieve the aforementioned object, the present invention provides yet another dual chip signal conversion device, comprising: a first substrate, one side surface thereof being provided with at least a first contact and a second contact while the other side surface thereof being provided with at least a third contact and a fourth contact, there being an electrical connection between the first and third contacts; a second substrate having a plurality of electrical contacts; a connecting portion for connecting the first and second substrates; a third substrate having a plurality of electrical contacts; a first chip disposed at one side surface of the first substrate and electrically connected to the second and fourth contacts; a second chip disposed at one side surface of the second substrate, the second chip being electrically connected to the first chip via the connecting portion and to the plurality of electrical contacts of the second substrate; and an antenna disposed within the third substrate and electrically connected to the plurality of electrical contacts of the third substrate; wherein the second and third substrates are electrically connected via their respective plurality of electrical contacts.

The aforementioned first chip is a signal processing unit.

The aforementioned second chip is an authentication unit which executes the encryption/decryption algorithm authenticated by the bank.

The aforementioned first and second chips are fabricated using Wafer Level Chip Scale Package (WLCSP) or chip on film (COF) technology.

The aforementioned first chip converts the signals, which include data signals, between the second and fourth contacts.

The aforementioned first and third contacts electrically connect to electrical grounding.

The aforementioned first and third contacts electrically connect to power source.

The aforementioned first and second contacts are configured to electrically connect to a SIM card.

The aforementioned third and fourth contacts are configured to electrically connect to a portable communication device.

The aforementioned second substrate has a plurality of electrical contacts consisting of at least a pair of electrical contacts.

BRIEF DESCRIPTION OF THE DRAWINGS

FIG. 2A is a structure layout of a dual chip signal conversion device in accordance with a first embodiment of the present invention.

FIG. 2B is a structure layout of a dual chip signal conversion device in accordance with a second embodiment of the present invention.

FIG. 2C is a structure layout of a dual chip signal conversion device in accordance with a third embodiment of the present invention.

FIG. 3A is a structure layout of a dual chip signal conversion device in accordance with a fourth embodiment of the present invention.

FIG. 3B is a structure layout of a dual chip signal conversion device in accordance with a fifth embodiment of the present invention.

FIG. 3C is a structure layout of a dual chip signal conversion device in accordance with a sixth embodiment of the present invention.

FIG. 3D is a structure layout of a dual chip signal conversion device comprising an antenna and multiple pairs of electrical contacts in accordance with the fourth through sixth embodiments of the present inventions.

DETAILED DESCRIPTION OF THE PREFERRED EMBODIMENTS

Figure 1:
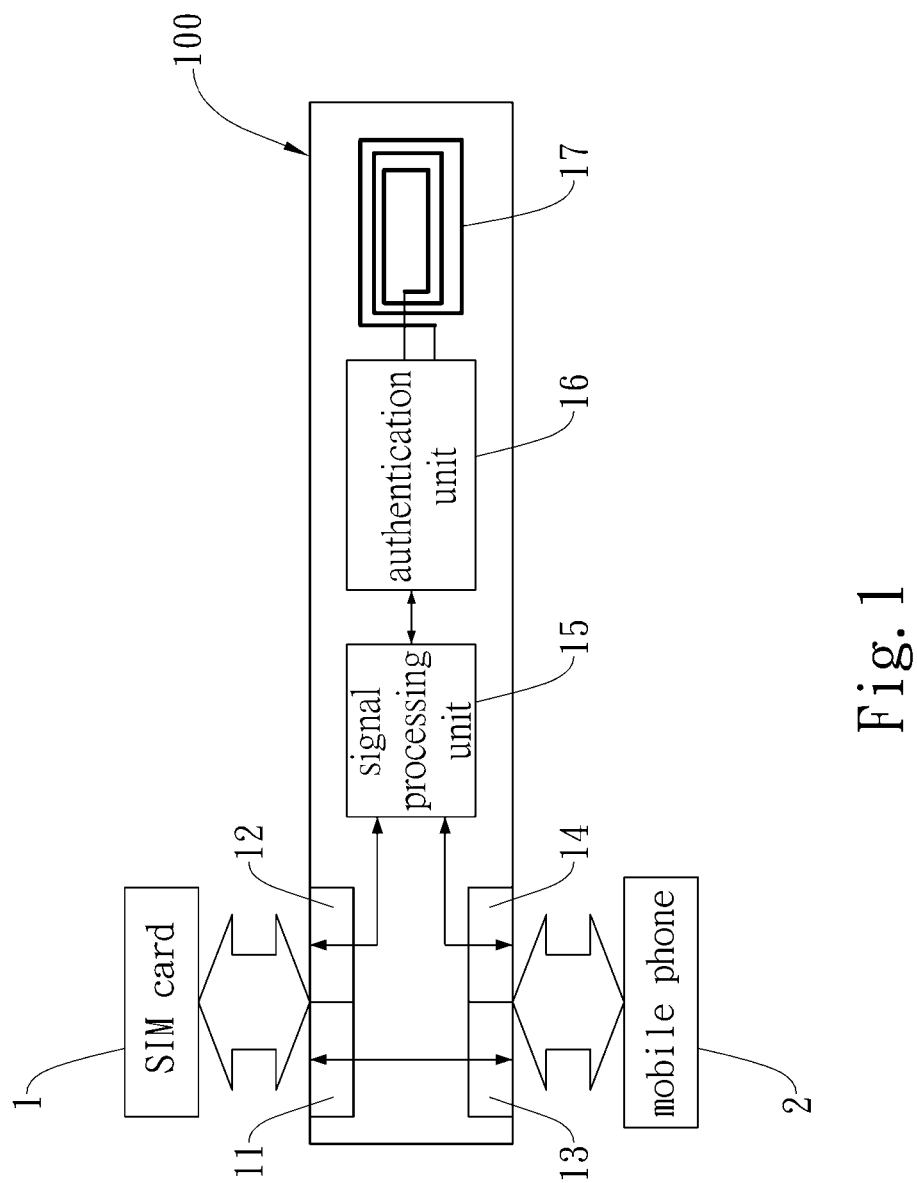
FIG. 1 is a block diagram of a dual chip signal conversion device in accordance with the present invention.

The present dual chip signal conversion device is disposed between a SIM/USIM card and a mobile phone to integrate relevant value-added services to the mobile phone. FIG. 1 is a block diagram of a dual chip signal conversion device in accordance with the present invention. The dual chip signal conversion device 100 comprises at least a first contact 11, at least a second contact 12, at least a third contact 13, at least a fourth contact 14, a signal processing unit 15, an authentication unit 16 and an antenna 17. The first and second contacts 11 and 12 are configured to electrically connect to a SIM card 1; the third and fourth contacts 13 and 14 are configured to electrically connect to a mobile phone 2; there is an electrical connection between the first and third contacts 11 and 13; the signal processing unit 15 is electrically connected to the second and fourth contacts 12 and 14; the authentication unit 16 is electrically connected to the signal processing unit 15 and the antenna 17.

Each of the signal processing unit 15 and authentication unit 16 is embodied as a chip of an integrated circuit, and the chip is fabricated using WLCSP or COF technology.

FIG. 2A is a structure layout of a dual chip signal conversion device in accordance with a first embodiment of the present invention. The dual chip signal conversion device comprises a first substrate 10, a second substrate 20 and a connecting portion 22 for connecting the first and second substrates 10 and 20. The first and second substrates 10 and 20 and the connecting portion 22 are fabricated using Flexible Printed Circuit Board (FPC) technology. One side surface of the first substrate 10 is provided with a second contact region comprising at least a third contact and a fourth contact which are configured to electrically connect to a portable communication device (e.g. a mobile phone). In one embodiment of the present invention, the second contact region comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact while C7. I/O may be regarded as the fourth contact. The other side surface of the first substrate 10 is provided with a first contact region comprising at least a first contact and a second contact which are configured to electrically connect to a SIM card, wherein there is an electrical connection between the first and third contacts. Additionally, certain area of the other side surface is coated with an adhesive material so that the other side surface can be adhered to the SIM card. In one embodiment of the present invention, the contacts of the first contact region also meet ISO 7816 international standards, and the locations thereof correspond to the locations of the contacts of the second contact region, wherein C1. Vcc and C5. GND may be regarded as the first contact while C7. I/O may be regarded as the second contact.

In the dual chip signal conversion device of the first embodiment of the present invention, a first chip 15 is disposed at one side surface of the second substrate 20 and electrically connected to the second and fourth contacts via the connecting portion 22, wherein the first chip 15 is a signal processing unit configured to convert the signals (e.g. data signals) between the second and fourth contacts. A second chip 16 is disposed at one side surface of the second substrate 20 and electrically connected to the first chip 15, wherein the second chip 16 is an authentication unit configured to execute the algorithm authenticated by the bank. An antenna 17 is disposed at one side surface of the second substrate 20 and electrically connected to the second chip 16.

It is to be noted that the first and second chips 15 and 16 may be disposed at either side surface of the second substrate 20, and that the antenna 17 may be disposed at either side surface of, or within, the second substrate 20.

FIG. 2B is a structure layout of a dual chip signal conversion device in accordance with a second embodiment of the present invention. The dual chip signal conversion device comprises a first substrate 10, a second substrate 20 and a connecting portion 22 for connecting the first and second substrates 10 and 20. The first and second substrates 10 and 20 and the connecting portion 22 are fabricated using FPC technology. One side surface of the first substrate 10 is provided with a second contact region comprising at least a third contact and a fourth contact which are configured to electrically connect to a portable communication device (e.g. a mobile phone). In one embodiment of the present invention, the second contact region comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact while C7. I/O may be regarded as the fourth contact. The other side surface of the first substrate 10 is provided with a first contact region comprising at least a first contact and a second contact which are configured to electrically connect to a SIM card, wherein there is an electrical connection between the first and third contacts. Additionally, certain area of the other side surface is coated with an adhesive material so that the other side surface can be adhered to the SIM card. In one embodiment of the present invention, the contacts of the first contact region also meet ISO 7816 international standards, and the locations thereof correspond to the locations of the contacts of the second contact region, wherein C1. Vcc and C5. GND may be regarded as the first contact while C7. I/O may be regarded as the second contact.

In the dual chip signal conversion device of the second embodiment of the present invention, a first chip 15 is disposed at one side surface of the first substrate 10 and electrically connected to the second and fourth contacts, wherein the first chip 15 is a signal processing unit configured to convert the signals (e.g. data signals) between the second and fourth contacts. A second chip 16 is disposed at one side surface of the second substrate 20 and electrically connected to the first chip 15 via the connecting portion 22, wherein the second chip 16 is an authentication unit configured to execute the algorithm authenticated by the bank. An antenna 17 is disposed at one side surface of the second substrate 20 and electrically connected to the second chip 16.

It is to be noted that the first chip 15 may be disposed at either side surface of the first substrate 10, that the second chip 16 may be disposed at either side surface of the second substrate 20, and that the antenna 17 may be disposed at either side surface of, or within, the second substrate 20.

FIG. 2C is a structure layout of a dual chip signal conversion device in accordance with a third embodiment of the present invention. The dual chip signal conversion device comprises a first substrate 10, a second substrate 20 and a connecting portion 22 for connecting the first and second substrates 10 and 20. The first and second substrates 10 and 20 and the connecting portion 22 are fabricated using FPC technology. One side surface of the first substrate 10 is provided with a second contact region comprising at least a third contact and a fourth contact which are configured to electrically connect to a portable communication device (e.g. a mobile phone). In one embodiment of the present invention, the second contact region comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact while C7. I/O may be regarded as the fourth contact. The other side surface of the first substrate 10 is provided with a first contact region comprising at least a first contact and a second contact which are configured to electrically connect to a SIM card, wherein there is an electrical connection between the first and third contacts. Additionally, certain area of the other side surface is coated with an adhesive material so that the other side surface can be adhered to the SIM card. In one embodiment of the present invention, the contacts of the first contact region also meet ISO 7816 international standards, and the locations thereof correspond to the locations of the contacts of the second contact region, wherein C1. Vcc and C5. GND may be regarded as the first contact while C7. I/O may be regarded as the second contact.

In the dual chip signal conversion device of the third embodiment of the present invention, a first chip 15 is disposed at one side surface of the first substrate 10 and electrically connected to the second and fourth contacts, wherein the first chip 15 is a signal processing unit configured to convert the signals (e.g. data signals) between the second and fourth contacts. A second chip 16 is disposed at one side surface of the first substrate 10 and electrically connected to the first chip 15, wherein the second chip 16 is an authentication unit configured to execute the algorithm authenticated by the bank. An antenna 17 is disposed at one side surface of the second substrate 20 and electrically connected to the second chip 16.

It is to be noted that the first and second chips 15 and 16 may be disposed at either side surface of the first substrate 10, and that the antenna 17 may be disposed at either side surface of, or within, the second substrate 20.

FIG. 3A is a structure layout of a dual chip signal conversion device in accordance with a fourth embodiment of the present invention. The dual chip signal conversion device comprises a first substrate 10, a second substrate 20, a connecting portion 22 for connecting the first and second substrates 10 and 20 and a third substrate 30. The first, second and third substrates 10, 20 and 30 and the connecting portion 22 are fabricated using FPC technology. One side surface of the first substrate 10 is provided with a second contact region comprising at least a third contact and a fourth contact which are configured to electrically connect to a portable communication device (e.g. a mobile phone). In one embodiment of the present invention, the second contact region comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact while C7. I/O may be regarded as the fourth contact. The other side surface of the first substrate 10 is provided with a first contact region comprising at least a first contact and a second contact which are configured to electrically connect to a SIM card, wherein there is an electrical connection between the first and third contacts. Additionally, certain area of the other side surface is coated with an adhesive material so that the other side surface can be adhered to the SIM card. In one embodiment of the present invention, the contacts of the first contact region also meet ISO 7816 international standards, and the locations thereof correspond to the locations of the contacts of the second contact region, wherein C1. Vcc and C5. GND may be regarded as the first contact while C7. I/O may be regarded as the second contact. Moreover, the second and third substrates 20 and 30 have respective plurality of electrical contacts 21 and 31 (e.g. bus or copper posts) via which the second and third substrates 20 and 30 are electrically connected.

In the dual chip signal conversion device of the fourth embodiment of the present invention, a first chip 15 is disposed at one side surface of the second substrate 20 and electrically connected to the second and fourth contacts via the connecting portion 22 and to the plurality of electrical contacts 21 of the second substrate 20, wherein the first chip 15 is a signal processing unit configured to convert the signals (e.g. data signals) between the second and fourth contacts. A second chip 16 is disposed at one side surface of the third substrate 30 and electrically connected to the plurality of electrical contacts 31 of the third substrate 30, wherein the second chip 16 is an authentication unit configured to execute the algorithm authenticated by the bank. An antenna 17 is disposed at one side surface of the third substrate 30 and electrically connected to the second chip 16.

It is to be noted that the first chip 15 may be disposed at either side surface of the second substrate 20, that the second chip 16 may be disposed at either side surface of the third substrate 30, and that the antenna 17 may be disposed at either side surface of, or within, the third substrate 30.

FIG. 3B is a structure layout of a dual chip signal conversion device in accordance with a fifth embodiment of the present invention. The dual chip signal conversion device comprises a first substrate 10, a second substrate 20, a connecting portion 22 for connecting the first and second substrates 10 and 20 and a third substrate 30. The first, second and third substrates 10, 20 and 30 and the connecting portion 22 are fabricated using FPC technology. One side surface of the first substrate 10 is provided with a second contact region comprising at least a third contact and a fourth contact which are configured to electrically connect to a portable communication device (e.g. a mobile phone). In one embodiment of the present invention, the second contact region comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact while C7. I/O may be regarded as the fourth contact. The other side surface of the first substrate 10 is provided with a first contact region comprising at least a first contact and a second contact which are configured to electrically connect to a SIM card, wherein there is an electrical connection between the first and third contacts. Additionally, certain area of the other side surface is coated with an adhesive material so that the other side surface can be adhered to the SIM card. In one embodiment of the present invention, the contacts of the first contact region also meet ISO 7816 international standards, and the locations thereof correspond to the locations of the contacts of the second contact region, wherein C1. Vcc and C5. GND may be regarded as the first contact while C7. I/O may be regarded as the second contact. Moreover, the second and third substrates 20 and 30 have respective plurality of electrical contacts 21 and 31 (e.g. bus or copper posts) via which the second and third substrates 20 and 30 are electrically connected.

In the dual chip signal conversion device of the fifth embodiment of the present invention, a first chip 15 is disposed at one side surface of the second substrate 20 and electrically connected to the second and fourth contacts via the connecting portion 22, wherein the first chip 15 is a signal processing unit configured to convert the signals (e.g. data signal) between the second and fourth contacts. A second chip 16 is disposed at one side surface of the second substrate 20 and electrically connected to the first chip 15 and to the plurality of electrical contacts 21 of the second substrate 20, wherein the second chip 16 is an authentication unit configured to execute the algorithm authenticated by the bank. An antenna 17 is disposed at one side surface of the third substrate 30 and electrically connected to the plurality of electrical contacts 31 of third substrate 30.

It is to be noted that the first and second chips 15 and 16 may be disposed at either side surface of the second substrate 20, and that the antenna 17 may be disposed at either side surface of, or within, the third substrate 30.

FIG. 3C is a structure layout of a dual chip signal conversion device in accordance with a sixth embodiment of the present invention. The dual chip signal conversion device comprises a first substrate 10, a second substrate 20, a connecting portion 22 for connecting the first and second substrates 10 and 20 and a third substrate 30. The first, second and third substrates 10, 20 and 30 and the connecting portion 22 are fabricated using FPC technology. One side surface of the first substrate 10 is provided with a second contact region comprising at least a third contact and a fourth contact which are configured to electrically connect to a portable communication device (e.g. a mobile phone). In one embodiment of the present invention, the second contact region comprises eight contacts (C1. Vcc, C2. RST, C3. CLK, C4. RFU, C5. GND, C6. Vpp, C7. I/O, C8. RFU) that meet ISO 7816 international standards, wherein C1. Vcc and C5. GND may be regarded as the third contact while C7. I/O may be regarded as the fourth contact. The other side surface of the first substrate 10 is provided with a first contact region comprising at least a first contact and a second contact which are configured to electrically connect to a SIM card, wherein there is an electrical connection between the first and third contacts. Additionally, certain area of the other side surface is coated with an adhesive material so that the other side surface can be adhered to the SIM card. In one embodiment of the present invention, the contacts of the first contact region also meet ISO 7816 international standards, and the locations thereof correspond to the locations of the contacts of the second contact region, wherein C1. Vcc and C5. GND may be regarded as the first contact while C7. I/O may be regarded as the second contact. Moreover, the second and third substrates 20 and 30 have respective plurality of electrical contacts 21 and 31 (e.g. bus or copper posts) via which the second and third substrates 20 and 30 are electrically connected.

In the dual chip signal conversion device of the sixth embodiment of the present invention, a first chip 15 is disposed at one side surface of the first substrate 10 and electrically connected to the second and fourth contacts, wherein the first chip 15 is a signal processing unit configured to convert the signals (e.g. data signals) between the second and fourth contacts. A second chip 16 is disposed at one side surface of the second substrate 20 and electrically connected to the first chip 15 via the connecting portion 22 and to the plurality of electrical contacts 21 of the second substrate 20, wherein the second chip 16 is an authentication unit configured to execute the algorithm authenticated by the bank. An antenna 17 is disposed at one side surface of the third substrate 30 and electrically connected to the plurality of electrical contacts 31 of the third substrate 30. It is to be noted that the first chip 15 may be disposed at either side surface of the first substrate 10, that the second chip 16 may be disposed at either side surface of the second substrate 20, and that the antenna 17 may be disposed at either side surface of, or within, the third substrate 30.

FIG. 3D is a structure layout of a dual chip signal conversion device comprising an antenna and multiple pairs of electrical contacts in accordance with the fourth through sixth embodiments of the present inventions. In the fourth through sixth embodiments of the present inventions, the plurality of electrical contacts 21 may consist of at least a pair of electrical contacts.

What is claimed is:

1. A dual chip signal conversion device, comprising:
a carrier comprising a first substrate, a second substrate and a connecting portion for connecting the first and second substrates, one side surface of the first substrate being provided with at least a first contact and a second contact while the other side surface of the first substrate being provided with at least a third contact and a fourth contact, there being an electrical connection between the first and third contacts;
a first chip disposed at one side surface of the carrier and electrically connected to the second and fourth contacts;
a second chip disposed at one side surface of the carrier and electrically connected to the first chip; and
an antenna disposed within the second substrate and electrically connected to the second chip,
wherein the first substrate is used to be attached to a SIM card; and
wherein the one side surface of the first substrate is coated with an adhesive material so that the one side surface of the first substrate can be adhered to the SIM card.

2. The dual chip signal conversion device according to claim 1, wherein the first chip is disposed at the one side surface of the second substrate and electrically connected to the second and fourth contacts via the connecting portion, and wherein the second chip is disposed at one side surface of the second substrate.

3. The dual chip signal conversion device according to claim 1, wherein the first chip is disposed at the one side surface of the first substrate, and wherein the second chip is disposed at one side surface of the second substrate and electrically connected to the first chip via the connecting portion.

4. The dual chip signal conversion device according to claim 1, wherein the first chip is disposed at the one side surface of the first substrate, wherein the second chip is disposed at the one side surface of the first substrate, and wherein the antenna is electrically connected to the second chip via the connecting portion.

5. The dual chip signal conversion device according to claim 1, wherein the first chip is a signal processing unit and the second chip is an authentication unit configured to execute an encryption/decryption algorithm authenticated by a bank.

6. The dual chip signal conversion device according to claim 1, wherein the first chip converts the signals between the second and fourth contacts, and wherein the signals are data signals.

7. The dual chip signal conversion device according to claim 1, wherein the first and second chips are fabricated using WLCSP or COF technology.

* * * * *